United States Patent
Naruse (10) Patent No.: US 11,325,866 B2
(45) Date of Patent: May 10, 2022

(54) ALUMINUM NITRIDE SINTERED BODY, METHOD OF MAKING THE SAME, AND SEMICONDUCTOR MANUFACTURING EQUIPMENT COMPONENT USING ALUMINUM NITRIDE SINTERED BODY

(71) Applicant: NGK SPARK PLUG CO., LTD., Nagoya (JP)

(72) Inventor: Noriyuki Naruse, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/932,109

(22) Filed: Jul. 17, 2020

(65) Prior Publication Data

US 2021/0017087 A1 Jan. 21, 2021

(30) Foreign Application Priority Data

Jul. 18, 2019 (JP) .............................. JP2019-132906
Jul. 8, 2020 (JP) .............................. JP2020-117613

(51) Int. Cl.
| | | |
|---|---|---|
| *H01T 23/00* | (2006.01) | |
| *C04B 35/581* | (2006.01) | |
| *H01L 21/683* | (2006.01) | |
| *H01L 21/67* | (2006.01) | |
| *C04B 35/64* | (2006.01) | |
| *C09K 11/64* | (2006.01) | |
| *C09K 11/08* | (2006.01) | |
| *H01L 21/687* | (2006.01) | |

(52) U.S. Cl.
CPC ............ *C04B 35/581* (2013.01); *C04B 35/64* (2013.01); *C09K 11/0883* (2013.01); *C09K 11/64* (2013.01); *H01L 21/67103* (2013.01); *H01L 21/6831* (2013.01); *H01L 21/6833* (2013.01); *H01L 21/68757* (2013.01); *C04B 2235/3865* (2013.01)

(58) Field of Classification Search
None
See application file for complete search history.

(56) References Cited

U.S. PATENT DOCUMENTS

| | | |
|---|---|---|
| 5,036,026 A | 7/1991 | Yamakawa et al. |
| 6,403,510 B1 | 6/2002 | Kuibira et al. |
| (Continued) | | |

FOREIGN PATENT DOCUMENTS

| | | |
|---|---|---|
| CN | 108706980 A | 10/2018 |
| JP | H06-116039 A | 4/1994 |
| JP | H06-86330 B2 | 11/1994 |
| (Continued) | | |

OTHER PUBLICATIONS

Taiwan Intellectual Property Office, Office Action (Notification for the Opinion of Examination) issued in corresponding Application No. TW 109124202 dated Sep. 7, 2021.

*Primary Examiner* — Stephen W Jackson
(74) *Attorney, Agent, or Firm* — Stites & Harbison, PLLC; Jeffrey A. Haeberlin; Trevor T. Graves (57) ABSTRACT

An aluminum nitride sintered body for use in a semiconductor manufacturing apparatus is provided. The aluminum nitride sintered body exhibits, in a photoluminescence spectrum thereof in a wavelength range of 350 nm to 700 nm obtained with 250 nm excitation light, a highest emission intensity peak within a wavelength range of 580 nm to 620 nm.

2 Claims, 5 Drawing Sheets

(56) References Cited

U.S. PATENT DOCUMENTS 7,803,733 B2 * 9/2010 Teratani ................ C04B 35/581
                                                    501/98.4
9,139,769 B2 * 9/2015 Emoto ............... C09K 11/7734

FOREIGN PATENT DOCUMENTS

| JP | 2813154 B2 | 10/1998 |
| JP | 2001-064079 A | 3/2001 |

* cited by examiner

ALUMINUM NITRIDE SINTERED BODY, METHOD OF MAKING THE SAME, AND SEMICONDUCTOR MANUFACTURING EQUIPMENT COMPONENT USING ALUMINUM NITRIDE SINTERED BODY

CROSS-REFERENCE TO RELATED APPLICATIONS

This application claims priority from Japanese Patent Application No. 2019-132906 filed on Jul. 18, 2019 and Japanese Patent Application No. 2020-117613 filed on Jul. 8, 2020, the entire contents of which are incorporated herein by reference.

TECHNICAL FIELD

The present disclosure relates to an aluminum nitride sintered body for use in a semiconductor manufacturing apparatus, to a method for producing the sintered body, and a semiconductor manufacturing equipment component using the aluminum nitride sintered body.

BACKGROUND

The color tone of an aluminum nitride sintered body easily varies depending on firing conditions, the type and amount of a firing aid used, etc. In production of large-scale parts from the aluminum nitride sintered body, variation in color tone is observed among the products, even when they are obtained under the same conditions. Also, color unevenness is easily generated in a single product.

Japanese Patent Application Laid-Open (kokai) No. 1994-116039 discloses that generation of stain or color unevenness of an aluminum nitride sintered body is suppressed by adding erbium (Er) to aluminum nitride in an amount of 5 wt. % or more as reduced to metallic Er. However, erbium (Er) is essentially an element which damages semiconductor devices, and application of such an aluminum nitride sintered body to components of a semiconductor manufacturing apparatus is discouraged.

SUMMARY

Objects of the present disclosure are to provide an aluminum nitride sintered body whose color unevenness can be suppressed and which is used in a semiconductor manufacturing apparatus; a method for producing the sintered body; and a semiconductor manufacturing equipment component using the aluminum nitride sintered body.

(1) In order to attain the aforementioned objects, the present disclosure provides an aluminum nitride sintered body for use in a semiconductor manufacturing apparatus, characterized in that the aluminum nitride sintered body exhibits, in a photoluminescence spectrum thereof in a wavelength range of 350 nm to 700 nm obtained with 250 nm excitation light, a highest emission intensity peak within a wavelength range of 580 nm to 620 nm.

Our experimental results have revealed that a conceivable cause for aggravating the color unevenness of an aluminum nitride sintered body is an increase in amount of oxygen (O) serving as an impurity thereto, which increase is attributed to certain environmental conditions. Based on the experimental results, the inventors have found that when the oxygen content of the aluminum nitride sintered body is reduced to such a level that the color unevenness is more effectively suppressed as compared with conventional cases, the aluminum nitride sintered body exhibits a highest emission intensity peak within a wavelength range of 580 nm to 620 nm, in a photoluminescence spectrum thereof (wavelength range: 350 nm to 700 nm) obtained through irradiation with 250 nm excitation light.

Thus, according to the present disclosure, there can be provided an aluminum nitride sintered body for use in a semiconductor manufacturing apparatus, wherein the color unevenness thereof can be more effectively suppressed as compared with conventional cases.

(2) The present disclosure also provides a method for producing an aluminum nitride sintered body, the method comprising:
a step of forming a compact, a debindered compact, or a calcined compact, containing aluminum nitride as a predominant ingredient, and
a firing step of firing the compact, the debindered compact, or the calcined compact, to thereby yield the aluminum nitride sintered body, wherein
a water adsorption ratio $(W2-W1)/W1$ is lower than 0.2 wt. %, wherein $W1$ is the weight of the compact, the debindered compact, or the calcined compact, as measured immediately after formation thereof, and $W2$ is the weight of the compact, the debindered compact, or the calcined compact, as measured just before firing thereof.

According to the present disclosure, there can be provided an aluminum nitride sintered body for use in a semiconductor manufacturing apparatus, wherein the color unevenness thereof can be more effectively suppressed as compared with conventional cases.

(3) The present disclosure also provides a component of the semiconductor manufacturing apparatus (also referred to as a semiconductor manufacturing equipment component), wherein the color unevenness thereof can be more effectively suppressed as compared with conventional cases.

According to the present disclosure, there can be provided a member of a semiconductor manufacturing apparatus, wherein the color unevenness thereof can be more effectively suppressed as compared with conventional cases.

(4) The present disclosure also provides an electrostatic chuck or a ceramic heater as a semiconductor manufacturing equipment component, wherein the color unevenness thereof can be more effectively suppressed as compared with conventional cases.

According to the present disclosure, there can be provided an electrostatic chuck or a ceramic heater, wherein the color unevenness thereof can be more effectively suppressed as compared with conventional cases.

DESCRIPTION OF EMBODIMENTS

Next will be described an aluminum nitride sintered body of an embodiment of the present disclosure.

The aluminum nitride sintered body of this embodiment is employed as a semiconductor manufacturing equipment component, such as an electrostatic chuck, a ceramic heater, or a susceptor, wherein a semiconductor wafer is to be mounted on such a component, for use in a semiconductor manufacturing apparatus.

The aluminum nitride sintered body production method employed in the present embodiment includes a step of storing a compact, a debindered compact, or a calcined compact, containing aluminum nitride as a predominant ingredient, such that a water adsorption ratio is adjusted to be lower than 0.2 wt. %. The water adsorption ratio is represented by formula $(W2-W1)/W1$, wherein $W1$ is the weight of the compact, the debindered compact, or the calcined compact, as measured immediately after formation thereof, and $W2$ is the weight of the compact, the debindered compact, or the calcined compact, as measured just before transfer thereof into a furnace for firing.

In the aluminum nitride sintered body, produced through firing the thus-stored compact, debindered compact, or calcined compact, color unevenness was mitigated as compared with conventional cases.

The mitigation in color evenness may conceivably be realized by reduction in oxygen (O) content of the produced aluminum nitride sintered body. The aluminum nitride sintered body of the present embodiment exhibited, in a photoluminescence spectrum thereof (wavelength range: 350 nm to 700 nm) obtained with 250 nm excitation light, a highest emission intensity peak within a wavelength range of 580 nm to 620 nm. The photoluminescence spectrum is measured by means of, for example, FP-8500 (product of JASCO Corporation).

Next will be described a method for producing an aluminum nitride sintered body through a press molding technique.

Firstly, in a granulation step, a binder, a plasticizer, and a dispersant are added to a raw material powder containing aluminum nitride powder (95 wt. %) and yttrium oxide powder (5 wt. %), to thereby form a granular powder. More specifically, the raw material powder and the additives are mixed together with a solvent, and the mixture is spray-dried, to thereby yield the granular powder. Subsequently, in a molding step, the granular powder is molded through cold isostatic pressing (CIP) into a predetermined shape (e.g., plate-like). The ingot obtained through CIP is mechanically worked, to thereby obtain a compact having a shape of interest. Then, in a debindering step, the binder of the compact is removed through, for example, a thermal treatment at 600° C. or lower in air, to thereby yield a debindered compact.

Subsequently, in the case where the debindered compact is not immediately fired, the debindered compact is subjected to a storage step so as to prevent, as much as possible, adsorption of water into the compact. In the storage step, there may be employed a technique of minimizing the amount of water adsorbed by aluminum nitride; e.g., cold storage at 10° C. or lower or freezer storage.

Then, the debindered compact is placed in a carbon mold and transferred into a furnace. The debindered compact is fired under nitrogen at 1,850° C. with uniaxially pressing at 10 MPa, to thereby yield an aluminum nitride sintered body.

The water adsorption ratio in the above case is represented by the formula $(W2-W1)/W1$, wherein $W1$ is the weight of the debindered compact as measured immediately after completion of the debindering step, and $W2$ is the weight of the debindered compact as measured just before transfer to the furnace.

So far, the aluminum nitride sintered body production method based on press molding has been described. However, no particular limitation is imposed on the aluminum nitride sintered body production method of the present disclosure, and various techniques other than press molding may also be employed. For example, the aluminum nitride sintered body production method may be based on hot-pressing of powder. The powder hot-pressing technique is almost the same as the press molding technique. However, in the aluminum nitride sintered body production method based on powder hot-pressing, aluminum nitride raw material powder and other materials are mixed with a solvent, and the mixture is subjected to granulation. The thus-obtained granular powder is subjected to the same storage step as employed in the press molding. Thereafter, the granular powder is charged into a mold such as a carbon mold, and the powder is fired with uniaxially pressing.

The water adsorption ratio in the above case is represented by the formula $(W4-W3)/W3$, wherein $W3$ is the weight of the granular powder per unit volume as measured immediately after completion of granulation, and $W4$ is the weight of the granular powder per unit volume as measured just before firing.

Figure 1:
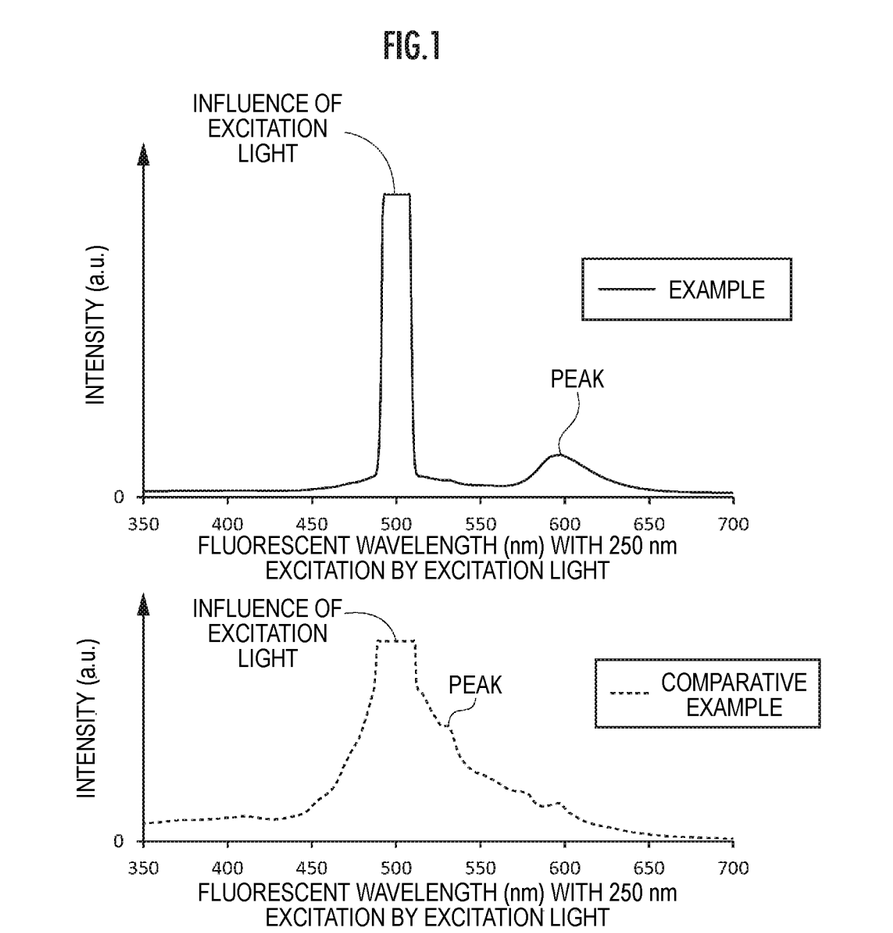
FIG. 1 A graph showing a photoluminescence spectrum of an aluminum nitride sintered body of an embodiment of the present disclosure obtained with 250 nm excitation light, and a graph showing the same photoluminescence spectrum of an aluminum nitride sintered body of Comparative Example.

FIG. 1 includes two graphs. One is a photoluminescence spectrum of an aluminum nitride sintered body of the embodiment (Example) obtained with 250 nm excitation light, and the other is a photoluminescence spectrum of an aluminum nitride sintered body of Comparative Example obtained with 250 nm excitation light. The aluminum nitride sintered body of Example was produced by forming a disk-shape compact (diameter: 370 mm, thickness: 25 mm) through press molding; thermally treating the compact in air at 600° C. or lower, to thereby yield a debindered compact; storing the compact according to the storing method of the embodiment before firing; and firing the thus-stored compact. The aluminum nitride sintered body of Comparative Example was produced by fabricating a debindered compact through the same method as employed in Example; conducting no particular control of storage conditions before firing; and firing the compact. In each spectrum, an emission intensity peak attributed to excitation light is observed in an area around 500 nm, corresponding to twice the excitation wavelength. As is clear from FIG. 1, the aluminum nitride sintered body of Example exhibited a highest emission intensity peak within a wavelength range of 580 nm to 620 nm in the measurement wavelength range of 350 nm to 700 nm. In contrast, the aluminum nitride sintered body of Comparative Example (as broken line) exhibited a highest emission intensity peak within a wavelength range of 510 nm to 550 nm.

In the above experiments, the debindered compact of Example was found to have a water adsorption ratio of 0.05 wt. %, and the debindered compact of Comparative Example was found to have a water adsorption ratio of 0.2 wt. %.

Based on the experimental results (see FIG. 1), the color unevenness of an aluminum nitride sintered body is conceivably aggravated by an increase in amount of oxygen (O) serving as an impurity thereto, which increase is attributed to certain environmental conditions, in particular the presence of water. Furthermore, based on the experimental results, the inventors have found that when the oxygen content of the aluminum nitride sintered body is reduced to such a level that the color unevenness is more effectively suppressed as compared with conventional cases, the aluminum nitride sintered body exhibits a highest emission intensity peak within a wavelength range of 580 nm to 620 nm, in a photoluminescence spectrum thereof (wavelength range: 350 nm to 700 nm) obtained through irradiation with 250 nm excitation light. A conceivable reason for the highest emission intensity peak within a wavelength range of 580 nm to 620 nm is the filling of oxygen defects with other substances.

In the case where the height of the emission intensity peak corresponds to a maximal value, the wavelength is employed as the peak wavelength. In the case where the emission intensity peak has an overlap with another emission intensity peak, the peak wavelength may be determined from a twice or thrice differentiated wave form.

Thus, according to the aluminum nitride sintered body of the embodiment, there can be provided an aluminum nitride sintered body for use in a semiconductor manufacturing apparatus, wherein the color unevenness thereof can be more effectively suppressed as compared with conventional cases.

A. Embodiment

Figure 2:
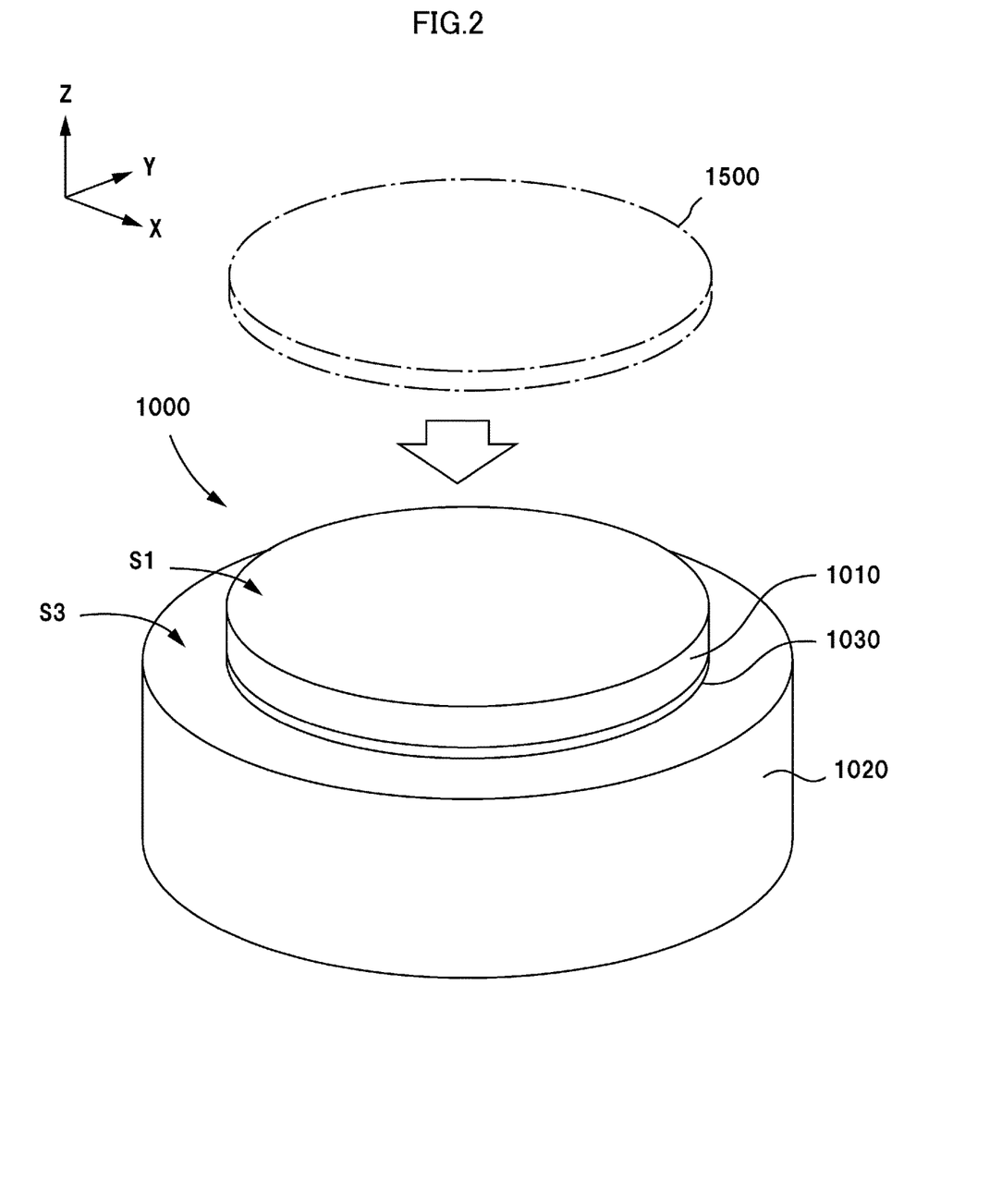
FIG. 2 A schematic perspective view of an appearance of an electrostatic chuck 1000 of the embodiment.
Figure 3:
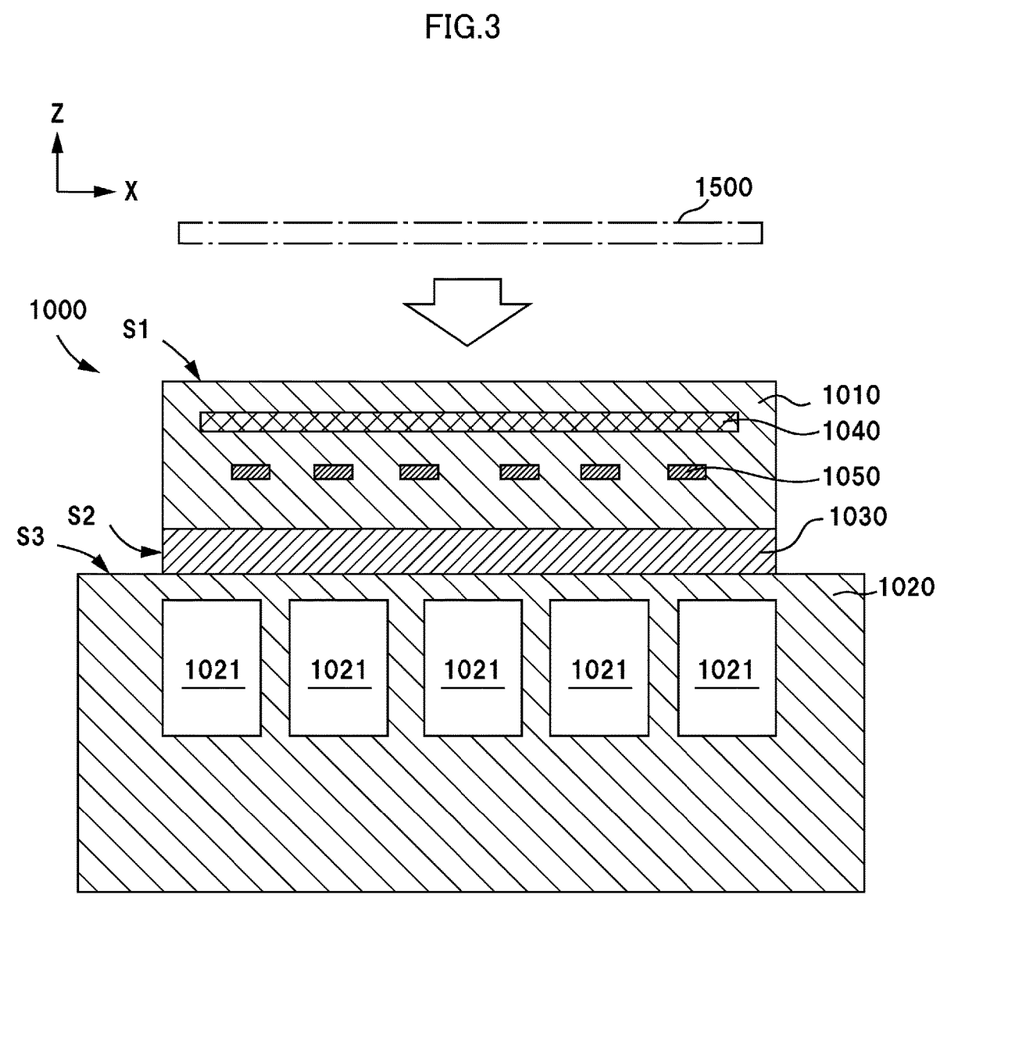
FIG. 3 A schematic explanatory view of the X-Z cross-section of the electrostatic chuck 1000 of the embodiment.

A-1. Structure of Electrostatic Chuck 1000:

FIG. 2 is a schematic perspective view of an appearance of an electrostatic chuck 1000 of the embodiment, and FIG. 3 a schematic explanatory view of the X-Z cross-section of the electrostatic chuck 1000 of the embodiment. In each of FIGS. 2 and 3, a mutually orthogonal X-Y-Z axis indicator is given for specifying the direction. In the present specification, the Z-axis positive direction denotes the upward direction, and the Z-axis negative direction denotes the downward direction, for the sake of convenience. However, in practice the electrostatic chuck 1000 may be placed in different directions for use.

The electrostatic chuck 1000 is a device which can attract and hold a work (e.g., a wafer 1500) through electrostatic attraction and is used in, for example, a vacuum chamber of a semiconductor manufacturing apparatus so as to fix the wafer 1500. The electrostatic chuck 1000 has a ceramic plate 1010 and a base plate 1020 which are arranged toward a specific direction (i.e., the vertical (Z-axis) direction in the embodiment). The ceramic plate 1010 and the base plate 1020 are arranged such that the lower face of the ceramic plate 1010 (hereinafter referred to as "ceramic side bonding face S2") and the upper face of the base plate 1020 (hereinafter referred to as "base side bonding face S3") oppositely face in the aforementioned direction of arrangement. The electrostatic chuck 1000 further includes a bonding layer 1030 which is placed between the ceramic side bonding face S2 of the ceramic plate 1010 and the base side bonding face S3 of the base plate 1020.

The ceramic plate 1010 is a plate-form (e.g., circular plate) member and is formed of a ceramic material. The diameter of the ceramic plate 1010 is, for example, about 50 mm to about 500 mm (generally about 200 mm to about 350 mm). The thickness of the ceramic plate 1010 is, for example, about 1 mm to about 20 mm.

The ceramic plate 1010 may be formed from any of various ceramic materials. From the viewpoints of strength, wear resistance, plasma resistance, compatibility to the below-mentioned material forming the base plate 1020, etc., a ceramic material predominantly containing, for example, aluminum oxide (alumina, $Al_2O_3$) or aluminum nitride (AlN) is preferably used. Notably, as used herein, the term "predominant component" refers to a component of the largest content (weight ratio).

In the ceramic plate 1010, there are disposed a pair of internal electrodes 1040 formed of an electrically conductive material (e.g., tungsten, molybdenum, or the like). Upon application of a voltage to the pair of internal electrodes 1040 from a power source (not illustrated), electrostatic attraction generates. By virtue of the electrostatic attraction, the wafer 1500 is attracted to and fixed on the upper surface of the ceramic plate 1010 (hereinafter referred to as an "attachment face S1").

Also, in the ceramic plate 1010, there is disposed a heater 1050 which is a resistance heater formed of an electrically conductive material (e.g., tungsten, molybdenum, or the like). Upon application of a voltage to the heater 1050 from a power source (not illustrated), the heater 1050 generates heat, to thereby heat the ceramic plate 1010. As a result, the wafer 1500 held on the attachment face S1 of the ceramic plate 1010 is heated. In this way, the temperature of the wafer 1500 can be controlled. Notably, in order to heat the attachment face S1 of the ceramic plate 1010 as uniformly as possible, the heater 1050 is disposed, for example, generally concentrically as viewed along the Z-axis direction.

The base plate 1020 is a circular, plate-form member having a diameter, for example, equal to or larger than that of the ceramic plate 1010 and is formed of a metallic material. The diameter of the base plate 1020 is, for example, about 220 mm to about 550 mm (generally about 220 mm to about 350 mm). The thickness of the base plate 1020 is, for example, about 20 mm to about 40 mm.

The base plate 1020 is preferably formed from a material, Al (aluminum) or Ti (titanium).

In the base plate 1020, a cooling medium flow path 1021 is provided. When a cooling medium (e.g., a fluorine-containing inert fluid, water, or the like) is caused to flow through the cooling medium flow path 1021, the base plate 1020 is cooled. By virtue of heat transfer between the base plate 1020 and the ceramic plate 1010 via the bonding layer 1030, the ceramic plate 1010 is cooled. As a result, the wafer 1500 held on the attachment face S1 of the ceramic plate 1010 is cooled. In this way, the temperature of the wafer 1500 can be controlled.

The bonding layer 1030 provides bonding between the ceramic plate 1010 and the base plate 1020. The thickness of the bonding layer 1030 is, for example, about 0.03 mm to about 1 mm.

Figure 4:
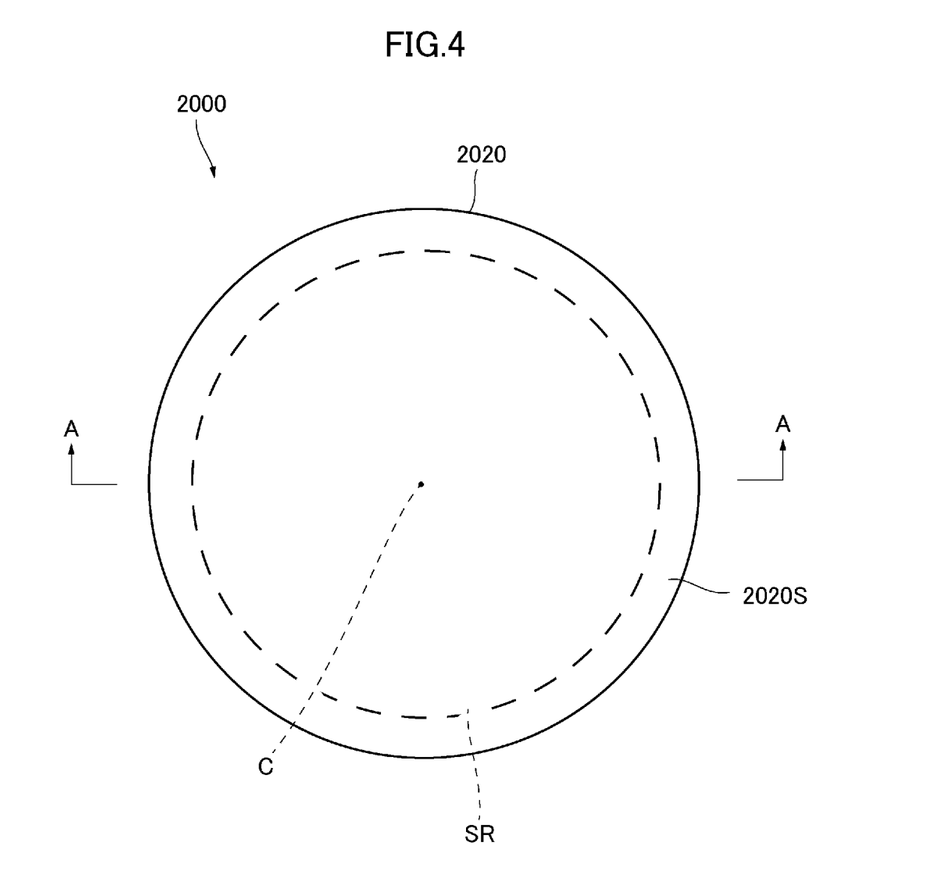
FIG. 4 A plan view of a ceramic heater.
Figure 5:
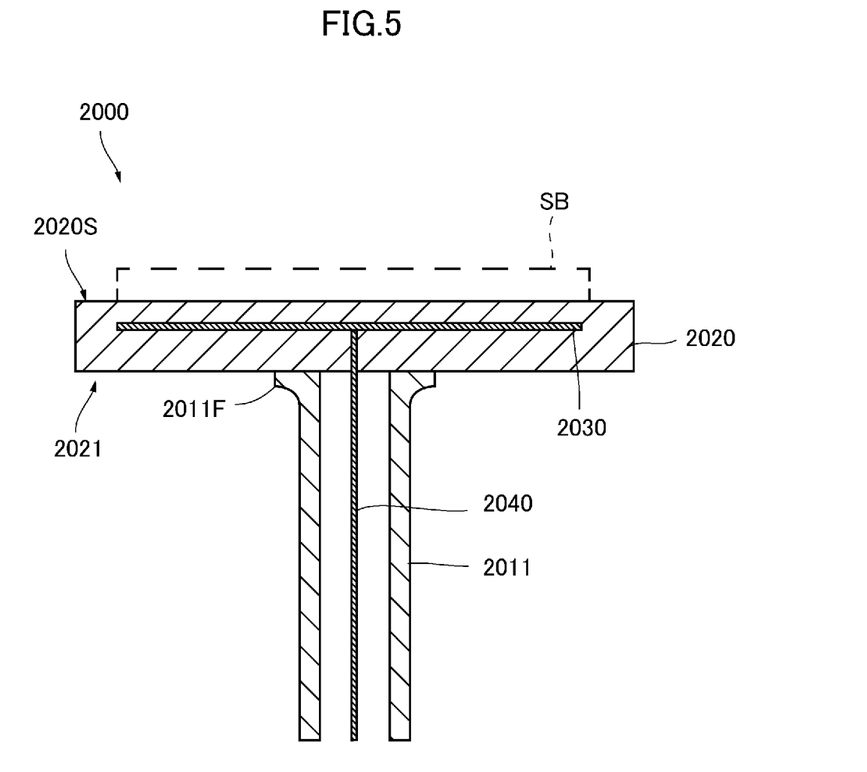
FIG. 5 A cross-section of the ceramic heater of FIG. 4, cut along line A-A.

A-2. Structure of Ceramic Heater 2000:

FIG. 4 is a plan view of the ceramic heater employed in the Example. FIG. 5 is a cross-section of the ceramic heater of FIG. 4, cut along line A-A.

A ceramic heater 2000 is a ceramic body according to the example. As shown in FIG. 4, the ceramic heater has a plate-form ceramic base 2020 formed of, for example, an AlN ceramic sintered body containing $Y_2O_3$.

The substrate 2020 has a disk shape. One face of the base 2020 serves as a substrate placement face 2020S. In addition to the aforementioned aluminum nitride, the base 2020 may be formed from a sintered body of a ceramic material such as silicon nitride, sialon, silicon carbide, boron nitride, or alumina.

As shown in FIG. 5, a substrate SB (represented by a broken line in FIG. 5) is placed on the substrate placement face 2020S in a contact manner.

A substrate placement region SR is provided within a circle of the substrate placement face 2020S having a center C.

A shaft 2011 serving as a support is a hollow, cylindrical shaft member. The shaft 2011 is formed of a sintered body of a ceramic material, such as alumina ($Al_2O_3$), aluminum nitride (AlN), or silicon nitride ($Si_3N_4$).

The shaft 2011 is provided with a flange portion 2011F at one axial end thereof. The shaft 2011 is attached to a lower face 2021 (a main surface) of the base 2020 by the mediation of the end where the flange portion 2011F is formed. For example, the shaft 2011 is connected to the base 2020 through solid phase joining of the lower face 2021 of the base 2020 to the surface of the flange portion 2011F.

An electrode 2030 serving as a metal electrode layer is a heating resistor buried in the base 2020. A power supply rod 2040 serving as a metal terminal is electrically connected, with one end thereof, to the electrode 2030. The power supply rod 2040 is connected to, with the other end thereof, to a power source (not illustrated). That is, electric power is supplied from the power source to the electrode 2030 via the power supply rod 2040. The electrode 2030 is a heater which generates heat through supply of the electric power, whereby the entirety of the base 2020 is heated. Being not illustrated, a plurality of power supply rods 2040 are electrically connected to the electrode 2030.

The electrode 2030 is buried in the base such that the electrode extends over the substrate placement region SR, as viewed in the direction orthogonal to the substrate placement face 2020S. Also, the electrode 2030 has a mesh-shape, as viewed in, for example, the direction orthogonal to the substrate placement face 2020S. The electrode 2030 is formed of a metallic material such as molybdenum.

The power supply rod 2040 is formed into a columnar shape, such that the rod extends along the axial direction of the shaft 2011 in the hollow portion of the shaft 2011, and one end of the rod extends to the inside of the base 2020.

The power supply rod 2040 may be formed of nickel (Ni) or the like. Notably, the power supply rod 2040 may have a columnar shape, a polygonal columnar shape, a truncated conical shape, etc.

What is claimed is:

1. A semiconductor manufacturing equipment component employing an aluminum nitride sintered body for use in a semiconductor manufacturing apparatus, wherein, in a photoluminescence spectrum thereof in a wavelength range of 350 nm to 700 nm obtained with 250 nm excitation light, the aluminum nitride sintered body exhibits a highest emission intensity peak within a wavelength range of 580 nm to 620 nm.

2. The semiconductor manufacturing equipment component according to claim 1, wherein the semiconductor manufacturing apparatus is an electrostatic chuck, a ceramic heater, or a susceptor.

* * * * *